United States Patent [19]
Venugopal et al.

[11] Patent Number: 5,939,712
[45] Date of Patent: Aug. 17, 1999

[54] ABSOLUTE POSITION DETECTION WITHIN 1 REVOLUTION USING 3-CHANNEL INCREMENTAL ENCODERS WITH HIGH RESOLUTION INDEX TRACK

[75] Inventors: Prasad V. Venugopal, Sunnyvale; Nan Jiang, Fremont, both of Calif.

[73] Assignee: Hewlett-Packard Company, Palo Alto, Calif.

[21] Appl. No.: 08/866,033

[22] Filed: May 30, 1997

[51] Int. Cl.[6] .................................................. G01D 5/34
[52] U.S. Cl. ................... 250/231.13; 250/214 PR
[58] Field of Search ................ 250/231.13, 214 PR, 250/231.14, 231.18; 341/13, 3

[56] References Cited

U.S. PATENT DOCUMENTS 4,628,298  12/1986  Hafle et al. .
5,418,362  5/1995  Lusby et al. ....................... 250/231.18

FOREIGN PATENT DOCUMENTS

0575663A1  12/1993  European Pat. Off. .
4041491A1   6/1992  Germany .
19532903A1  3/1997  Germany .

*Primary Examiner*—Que Le
*Attorney, Agent, or Firm*—Pamela Lau Kee

[57] ABSTRACT

The quasi-absolute encoder module determines absolute position within one mechanical rotation. The encoder module includes a three channel position encoder and detection circuitry that includes a read-only memory (ROM). There are three channels: A, B, and I. Channels A and B have four periods and channel B is offset from channel A by 90° in phase. Channel I has a unique sequence. The address generated by sampling this unique sequence corresponds to an address in ROM. The address indicates the position of the rotating shaft on which the codewheel is attached.

5 Claims, 7 Drawing Sheets

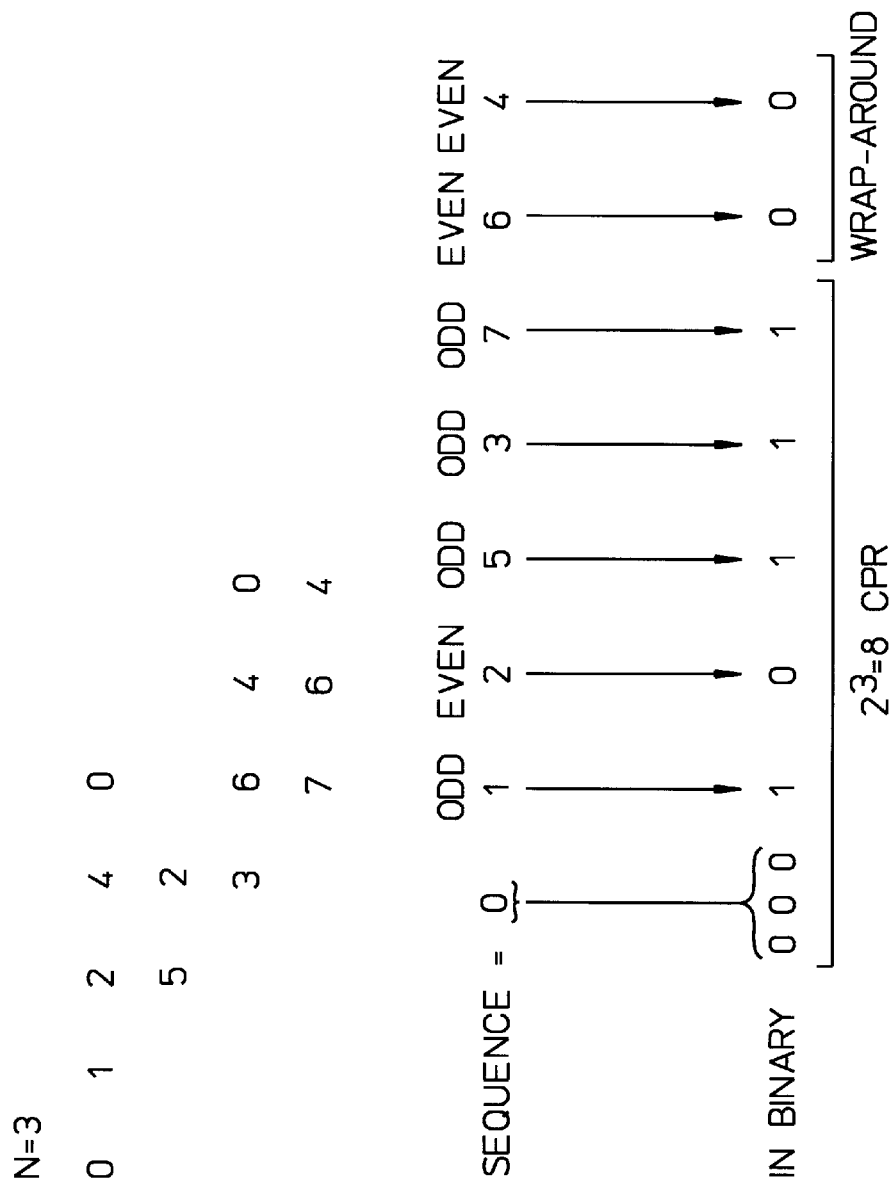

| CHI FOR N=3 IN THE +Ve DIRECTION | CHI FOR N=3 IN THE -Ve DIRECTION | ABSOLUTE POSITION |
|---|---|---|
| 0  0  0 | 0  1  0 | 135° |
| 0  0  1 | 1  0  1 | 180° |
| 0  1  0 | 1  1  0 | 225° |
| 1  0  1 | 1  1  1 | 270° |
| 0  1  1 | 0  1  1 | 315° |
| 1  1  1 | 0  0  1 | 360° OR 0° |
| 1  1  0 | 0  0  0 | 45° |
| 1  0  0 | 1  0  0 | 90° |

*Figure 3B*

ABSOLUTE POSITION DETECTION WITHIN 1 REVOLUTION USING 3-CHANNEL INCREMENTAL ENCODERS WITH HIGH RESOLUTION INDEX TRACK

FIELD OF THE INVENTION

The invention is directed towards the field of rotary absolute position detection using 3-channel incremental optical encoders. In particular, the invention is based on 3-channel incremental encoders having a high resolution index track (e.g. capable of one index pulse on the low-low state for every cycle of the quadrature signals of CH A and CH B) to determine the absolute position.

BACKGROUND OF THE INVENTION

Transmissive optical encoders are widely used to detect rotational movement. They consist of a "code wheel" attached to the rotating member whose movement needs to be monitored. The code wheel passes in between a light emitter and detector. On the code wheel are different "tracks"; patterns to block light or let light pass through. The interruptions of the light beam from the emitter are detected by the detector and signals are generated to determine rotational movement. Some manufacturers, including Hewlett-Packard, offer a "module" that contains an emitter and a detector in a package.

An absolute encoder indicates the absolute position of a rotating shaft upon power-up without any movement. An incremental 3-channel encoder with two quadrature signals and high resolution index signal may be used to detect absolute position within some movement if a unique pattern of index pulses is used. Since some movement is needed before absolute position can be determined after power-up, the encoder is called a "quasi-absolute" encoder. After finding absolute position, the encoder can keep track of incremental movement with high precision.

A 3-channel optical encoder, e.g. Hewlett-Packard HEDS 9140 that includes a 3-channel emitter and detector module, and a 3-channel code wheel generates channel A (CH A), channel B (CH B), and channel I (CH I). Signals CH A and CH B are in quadrature and are offset from each other by 90° in phase. These two signals are used to detect incremental change in position and direction of movement. Channel CH I is typically used as a signal that occurs once for every rotation of the code wheel and it indicates an "absolute zero" (or reference) position. A high resolution index track allows index pulses to occur on every cycle of signal CH A or CH B. A unique sequence of index pulses is used to determine the absolute position of a rotating member.

Many applications, e.g. brushless motor commutation and short local homing sequences for robotics, require absolute position sensing. A quasi-absolute solution is desirable because an incremental 3-channel encoder is less expensive than an absolute encoder and the incremental signals can be used for high precision position tracking once the absolute position is found.

SUMMARY OF THE INVENTION

The quasi-absolute encoder, e. g. a 3-channel encoder module and special code wheel, determines absolute position within one revolution. The pattern of signal CH I index pulses is designed using the method described in this application and a code wheel is designed with this pattern. The code wheel is mounted on a shaft and a pre-determined index pulse is aligned to a reference or "absolute zero" position just like what is done with a single index 3-channel encoder. Then, based on a decoding table, the absolute position can be determined from the index pulse sequence that is generated by the code wheel movement.

The quasi-absolute encoding system includes a programmable logic device (PLD) and read-only memory (ROM). The three signals from the encoder are channel A (CH A), channel (CH B), and channel (CH I). For each cycle (360° in phase) on signals CH A and CH B, there are four states. Signal CH B is offset from signal CH A by 90° in phase. Signal CH I can occur as often as once every cycle and has a unique sequence. The PLD decodes the unique pattern of the index pulses, determines direction of movement and provides a unique address to the ROM. This unique address in the ROM stores the absolute position of the code wheel.

The unique sequence is determined according to the flow-chart presented.

BRIEF DESCRIPTION OF THE DRAWINGS

FIG. 2 is an example of a unique sequence for N=3.

FIGS. 3A and 3B illustrate the encoder signals for the example shown in FIG. 2.

DETAILED DESCRIPTION OF THE DRAWINGS

Figure 1:
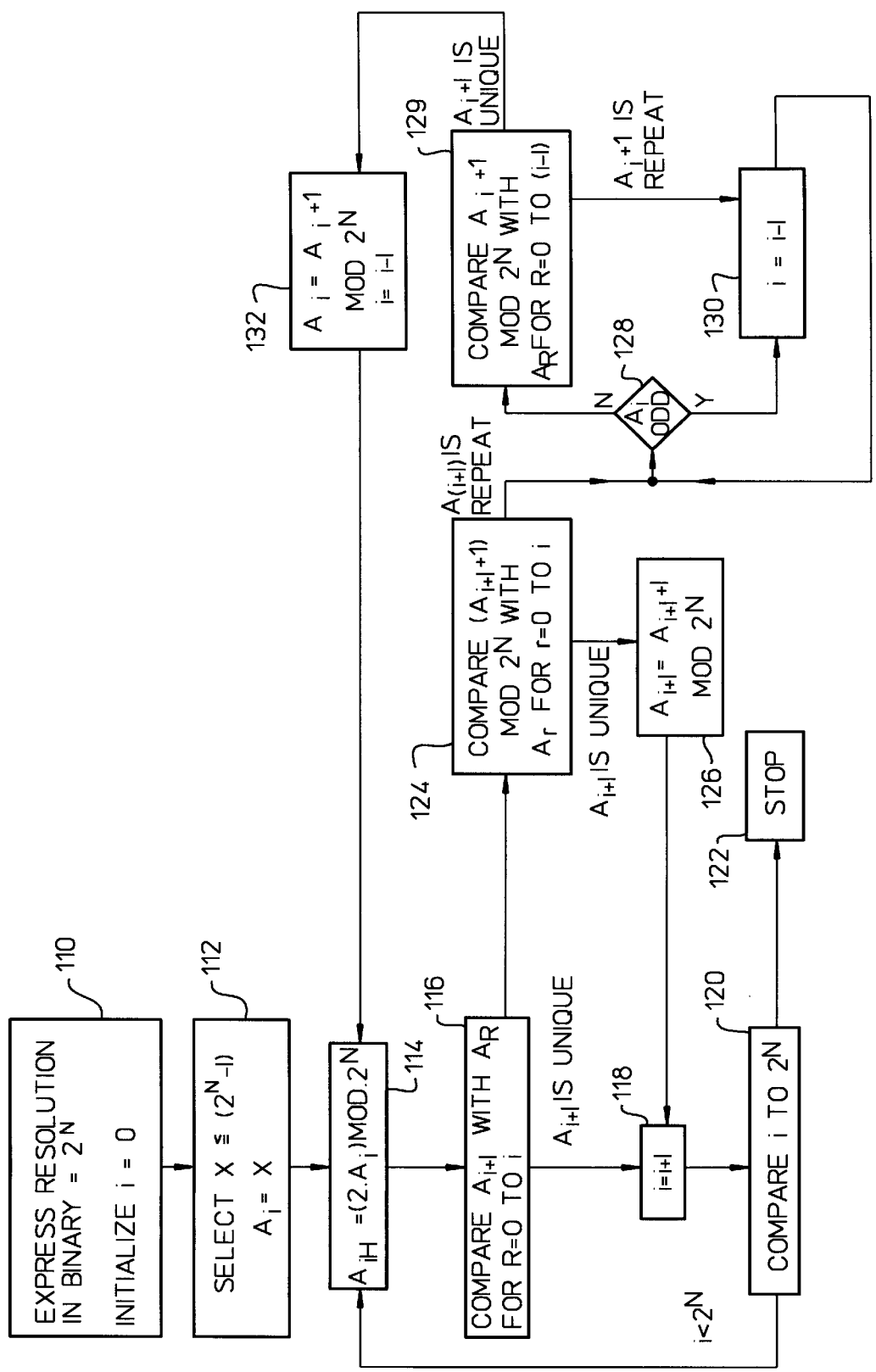
FIG. 1 is a process flow chart for determining a unique sequence for the index track.

FIG. 1 illustrates a process diagram for determining the unique sequence. In step 110, the desired resolution is expressed in binary $2^N$ and i are initialized to be 0. In step 112, x is selected to be less than the desired resolution and $A_i$ is set to x. In step 114, the next number in the sequence $A_{i+1}$ is twice the previous number in the sequence $A_i$ modulus $2^N$. In step 116, the next number $A_{i+1}$ is compared to the numbers in the sequence $A_R$, for R=0 to i. If the next number $A_{i+1}$ is unique, then i incremented by 1 (step 118). In step 120, i is less than $2^N$, then return to step 114. If i is equal to or exceeds $2^N$, then stop (step 122)

If the next number $A_{i+1}$ is a repeat, $A_{i+1}+1$ mod $2^N$ is compared to the numbers in the sequence $A_r$, for r=0 to I (step 124). If $A_{i+1}+1$ is unique, then the next number $A_{i+1}$ is incremented by 1 (step 126). The procedure continues with step 118. If $A_{i+1}+1$ is a repeat, check whether $A_i$ is an odd number (step 128). If not, then the $(A_i+1)$ mod $2^N$ is compared to the numbers in the sequence $A_R$, for R=0 to i−1 (step 129). If $A_i$ is odd or if $A_i+1$ is a repeat, then i is decremented by 1 (step 130). Return to step 128. If $A_i+1$ is unique, then $A_i$ is set to $(A_i+1)$ mod $2^N$ and i is decremented by 1 (step 132). Return to step 114.

FIG. 2 illustrates the results for a desired resolution of 8 counts per revolution (CPR), N=3. Although this process determines a unique sequence for the desired resolution, the sequence may be truncated with some care and used for a codewheel having less resolution, e.g. a desired resolution of 6.

Figure 3A:
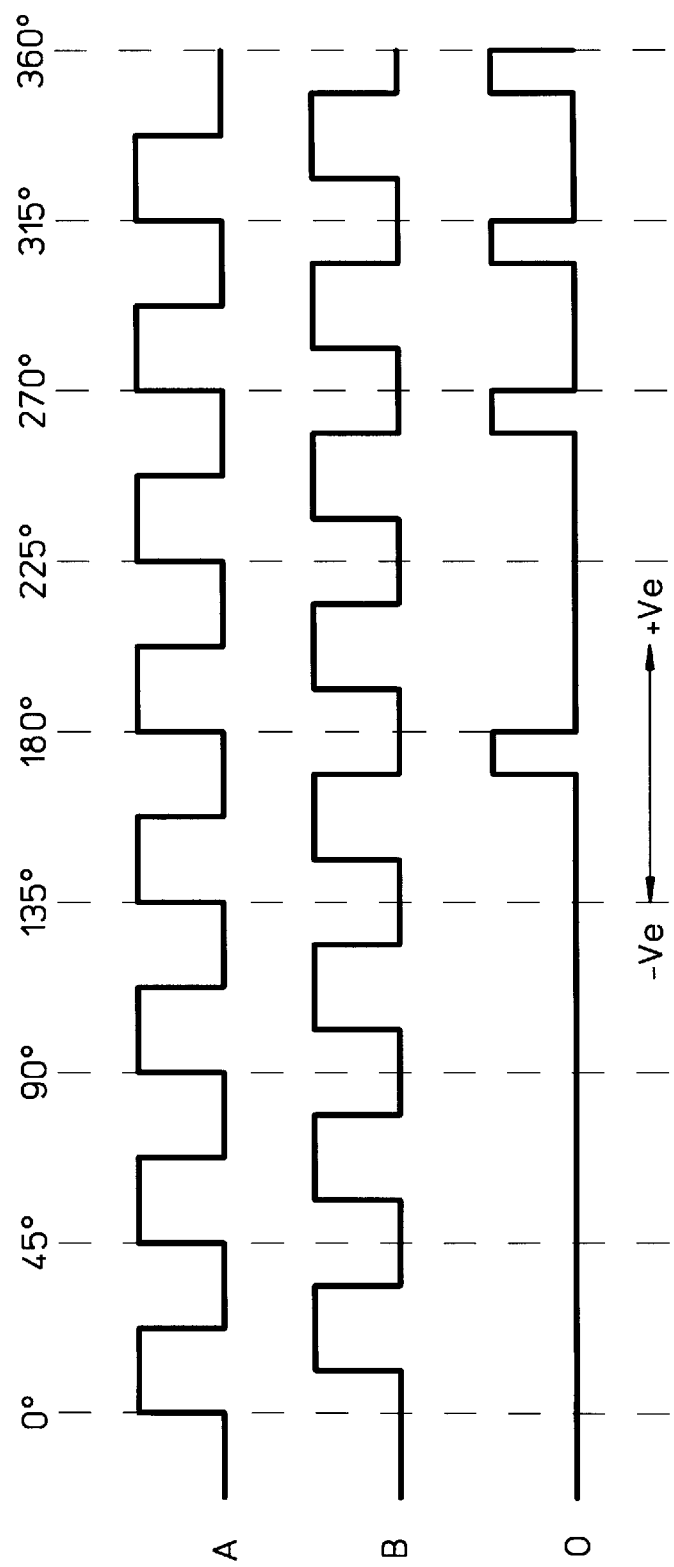

FIGS. 3A and 3B illustrates three channels of an optical encoder module for the example shown in FIG. 2. CH I is sampled for three cycles on either CH A or CH B, and the serial pattern that CH I generates is different for each position of the code wheel where the samples are taken. This serial pattern combined with the direction information obtained from CH A and CH B within one quadrature state of movement is used to determine the absolute position as shown in the table. Thus, within any three cycles maximum on CH A or CH B (equivalent to 135 mechanical degrees), the absolute position can be found.

Thus, an encoder having a resolution of 1024 bits can give the absolute position within 10 samples, one for each cycle on CH A or CH B given the direction information. The direction information can be found within one quadrature state and earlier than the position information. For a 1024 CPR quasi-absolute encoder, this is equivalent to a 12-bit absolute position encoder. For a 512 CPR quasi-absolute encoder, this is equivalent to an 11-bit absolute position encoder. For a 256 CPR quasi-absolute encoder, this is equivalent to a 10-bit absolute position encoder.

Figure 4:
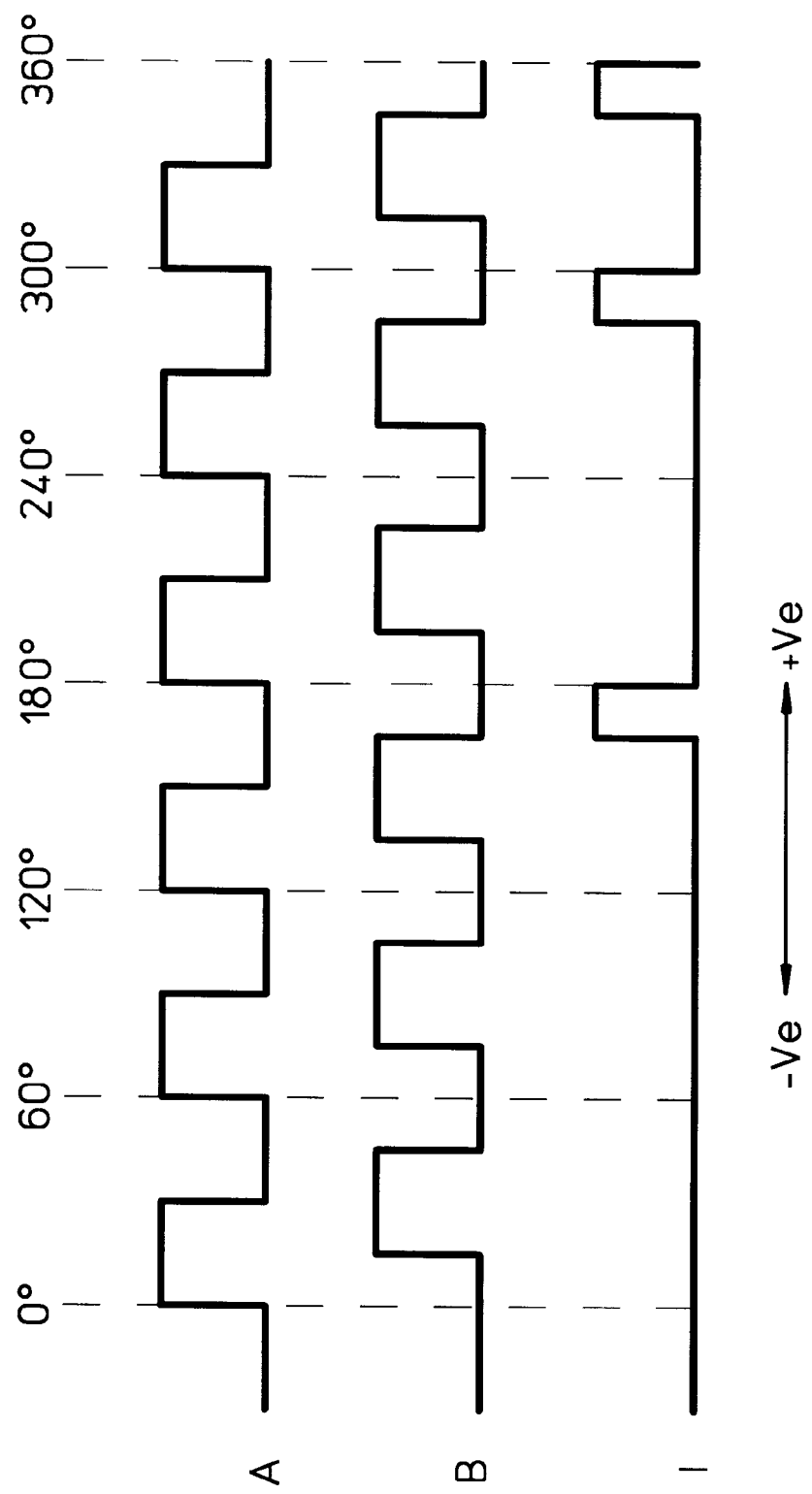
FIG. 4 illustrates the encoder signals for a truncated unique sequence.

FIG. 4 illustrates three channels of an optical encoder module for a truncated sequence. Although N was selected to be 3, in this example, the desired resolution is 6, a subset of the original unique sequence.

Figure 5:
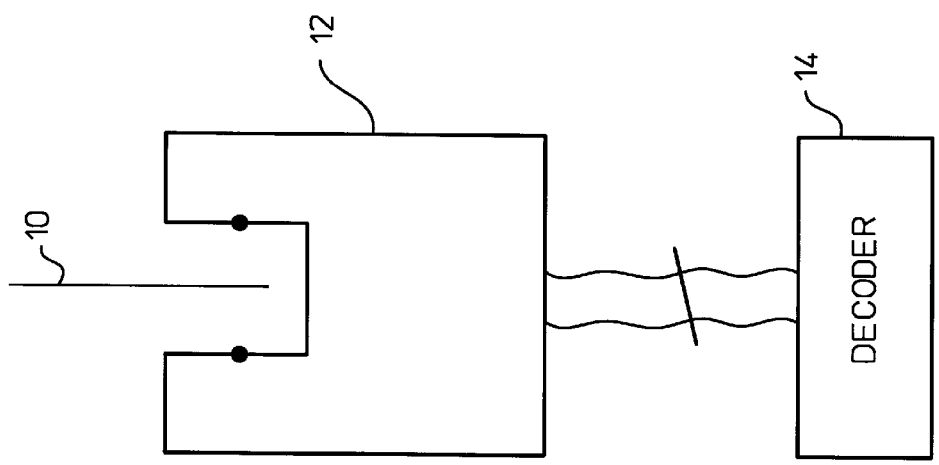
FIG. 5 illustrates a system using the code wheel and module of the present invention.

FIG. 5 illustrates a system using the aforementioned codewheel. The codewheel 10 is positioned within an encoder module 12. The encoder module is further connected to a decoder 14.

The decoding of the sampling may be done either in software or hardware. For a software decoder, a table look-up procedure is used to determine the absolute position. Often, the absolute position must be initialized to determine a starting point. The speed of rotation of the encoder module should be slower than the overall performance of the software decoder.

Figure 6:
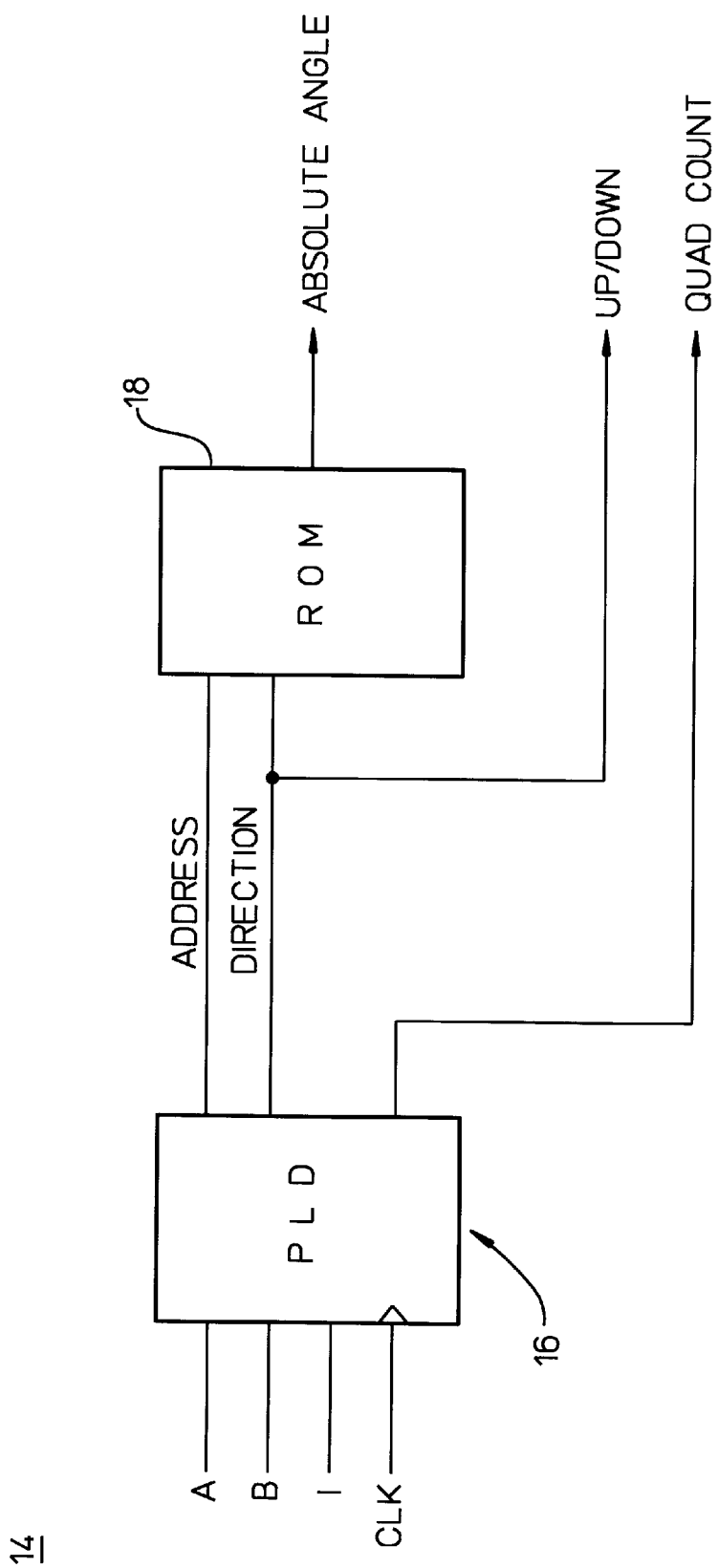
FIG. 6 illustrates the decoder shown in FIG. 5.

FIG. 6 illustrates a hardware implementation of the decoder shown in FIG. 6. A programmable logic device receives 16 as inputs CH A, CH B, CH I, and a CLOCK signal. A read-only memory module (ROM) 18 has an absolute angle.

The programmable logic device 16 outputs an address, direction of rotation, and a signal that corresponds to the quadrature count. The address is determined by sampling the CH I signal as described in FIG. 3. This address is N bits long. The address combined with the UP/DOWN signal points to an address location in the ROM 18 where the absolute address is stored. The storage capacity of the ROM is $2^{N+1}$. The quadrature count and the UP/DOWN signal may be used by an optional counter to count in quadrature.

We claim:

1. A "quasi"-absolute position detection apparatus comprising:

a codewheel having two direction tracks and an index track;

wherein the two direction tracks, each of the two direction tracks has four states, wherein one of the two direction tracks leads the other of the tracks by 90°; and wherein the index track has a binary sequence, each number in the binary sequence corresponds to a unique position of the codewheel.

2. An apparatus, as defined in claim 1, further comprising:

an encoder module, wherein the codewheel is positioned within the module, being operative to generate an index track signal that corresponds to the binary sequence and two direction track signal that indicate the direction of rotation of the codewheel.

3. An apparatus, as defined in claim 2, further comprising a decoder, connected to the encoder module, being operative to detect absolute position of the codewheel according to the index track signal.

4. An apparatus, as defined in claim 3, wherein the decoder is a look-up table, each entry in the look-up table corresponding to the unique position of the codewheel.

5. An apparatus, as defined in claim 3, wherein the decoder is read-only memory, each address corresponding to the unique position of the codewheel.

* * * * *